US006774671B2

United States Patent
Barnes

(10) Patent No.: US 6,774,671 B2
(45) Date of Patent: Aug. 10, 2004

(54) MULTI-PURPOSE TRANSISTOR ARRAY

(75) Inventor: James O. Barnes, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 121 days.

(21) Appl. No.: 09/828,083

(22) Filed: Apr. 5, 2001

(65) Prior Publication Data

US 2002/0027446 A1 Mar. 7, 2002

Related U.S. Application Data

(63) Continuation-in-part of application No. 09/419,425, filed on Oct. 15, 1999, now Pat. No. 6,236,232.

(51) Int. Cl.[7] ............................................. H03K 19/177
(52) U.S. Cl. ............................. 326/44; 326/38; 326/41; 326/102
(58) Field of Search ............................... 326/37–41, 44, 326/101–103

(56) References Cited

U.S. PATENT DOCUMENTS

| | | | |
|---|---|---|---|
| 5,051,917 A | * | 9/1991 | Gould et al. .................. 716/17 |
| 5,132,571 A | | 7/1992 | McCollum et al. ...... 307/465.1 |
| 5,341,092 A | | 8/1994 | El-Ayat et al. .......... 324/158 R |
| 5,391,943 A | | 2/1995 | Mahant-Shetti et al. ...... 326/41 |
| 5,959,905 A | * | 9/1999 | Payne ........................ 365/200 |
| 6,054,872 A | * | 4/2000 | Fudanuki et al. ............. 326/39 |
| 6,236,232 B1 | * | 5/2001 | Barnes ........................ 326/44 |
| 6,414,518 B1 | * | 7/2002 | Patel et al. ................. 326/101 |
| 2002/0163354 A1 | * | 11/2002 | Bingert et al. ................ 326/10 |

* cited by examiner

Primary Examiner—Don Le

(57) ABSTRACT

The addition of an array of transistors through areas of the circuit where active devices normally don't exist, such as under routing channels. By connecting this array of transistors such that the gates are tied to one power supply and the sources and drains to another, the transistors act as bypass capacitors between the power supplies and act to reduce noise on the supplies. Also, the transistors may later be reconnected through changes in the design to form diodes, inverters, buffers, or other logic gates to allow changes to the circuit late in the design cycle.

23 Claims, 10 Drawing Sheets

MULTI-PURPOSE TRANSISTOR ARRAY

RELATION TO PREVIOUS APPLICATION

This application is a continuation-in-part of application Ser. No. 09/419,425 filed on Oct. 15, 1999 now U.S. Pat. No. 6,236,232.

BACKGROUND OF THE INVENTION

1. Field of the Invention

This invention relates generally to the field of integrated circuits. More specifically, this invention relates to the creation of transistor arrays in areas of the integrated circuit that are typically not used for active device, such as the area under routing channels.

2. Description of the Prior Art

In the design of integrated circuits, a common design process is to build large blocks using a module generator or by hand. These blocks are then routed together at the top level of the integrated circuit. In hierarchical design methodologies, this process may be used at several different levels of hierarchy. Many designs allow for spaces between these blocks to allow for routing. Also, often the modules, or component pieces of the modules, do not fit together exactly and gaps are left between or within modules of the integrated circuit. These gaps or routing channels typically are unused except for the interconnect layers.

As integrated circuit processes progress to smaller and smaller transistor geometries, several problems manifest themselves. With smaller and faster transistors, routing delay due to the resistance and capacitance of the interconnect wiring becomes a larger and larger part of the total circuit delay. Often, for very long interconnect traces, it is necessary to buffer the signal for performance. As those skilled in the art realize, there is an ideal location for a single buffer, typically near the midpoint of the routing trace. Sometimes it is necessary to add several buffers distributed along the length of the route.

As gate oxide thickness shrinks with more advanced processing, the gates become very susceptible to damage during processing due to charge collecting on the interconnect layers attached to the gates. For example, a very small gate connected to a very large area of first level metal may be damaged during processing as charge builds up on the metal with no discharge path except through the gate oxide. This problem may also occur in circuits that have a connection to active area in addition to gate connections. If the connection to active area is very far away from the gate, and the connection uses upper levels of interconnect, charge may still build up on the lower levels of interconnect during fabrication, since the upper levels may not have been deposited yet to complete the connection to the active area. Due to this problem, designers must carefully construct their interconnect such that a discharge path for this charge is available at all stages in the process where charge collection may occur.

Further problems result from the ever increasing switching current per unit area as processes become faster and smaller. This switching current causes spikes, or dips, in the power supplies that may become quite severe in circuits where a large number of gates switch simultaneously. The spikes, or dips, in the power supplies, often called ground bounce when they occur on the ground mode, may be sufficient to move the supply voltage beyond the threshold voltage of the field effect transistors (FETs) and cause functional failures. One mitigating design technique is the addition of bypass capacitors between the power supplies. This is difficult to accomplish on the integrated circuit, since capacitors take up large amounts of area, raising the cost of the circuit.

As integrated circuits become smaller and faster, the number of processing steps required for production tends to increase. This often requires a larger number of masks to fabricate the circuits. Also, as geometries shrink, the mask production becomes more difficult and hence more expensive. When an error is found in the design of an integrated circuit, the masks often must be completely rebuilt to correct the error. Since masks are expensive, designers work very hard to make their fixes in the fewest number of masks as possible. Also, since fabrication of integrated circuits takes a substantial amount of time, it is desirable to make the changes to the masks which are used at the latest possible step in the fabrication process so that fabrication of the corrected circuit may begin with the existing masks simultaneously with the manufacture of the corrected masks. This reduction in the time required for error repairs is very valuable to the designers of the system that the integrated circuit will be used in.

One of the most common design errors is the creation of a signal that is too slow to meet the speed requirements of the circuit. Sometimes this error may be fixed by buffering the signal to speed up the transition times of the signal. This fix requires the placement of a buffer or buffers somewhere within the routing path of the signal.

In integrated circuit processes that use chemical mechanical polishing (CMP) for planarization, it is necessary to have a fairly even distribution of elements at each layer in the process where CMP is used. Often designers must place large areas of active area, polysilicon, or metal in the large unused areas of an integrated circuit to meet these CMP requirements.

As integrated circuit operating frequencies increase, radiated emissions from the circuit become an increasing problem. When large numbers of devices simultaneously switch in a circuit, the high frequency components of the power supply noise causes radiated emissions that must be suppressed to meet FCC rules. This suppression is often accomplished by adding bypass capacitors to the power supplies.

There is a need for a method of automatically adding transistors to the unused areas of an integrated circuit in a default configuration of adding bypass capacitance to the power supplies. This transistor array must be modifiable to form signal buffers, charge dissipation paths, or other function circuits as needed.

SUMMARY OF THE INVENTION

An array of transistors is added to an integrated circuit, after floorplanning has been completed. The array is placed in many of the areas that are unused by the functional circuitry of the integrated circuit. These transistors may be placed automatically by a computer program, and are connected to the power supplies such that they act as bypass capacitors between the power supplies to reduce noise on the power supplies. The capacitance also acts to reduce radiated emissions from the integrated circuit during operation. Furthermore, selected transistors in an array may be modified, either by hand or by software, to act as a buffer for signals routed long distances on the integrated circuit. Also, selected transistors may be connected to form charge draining diodes where necessary to prevent charge collection damage of the gates of metal-oxide-semiconductor field effect transistors (MOSFETs) during processing of the integrated circuit. Finally, if necessary, selected transistors may be modified, by changes only to the interconnect layers, to correct functional errors in the integrated circuit. This may be done after fabrication through use of a focused ion beam (FIB) or through an interconnect-only mask modification.

Other aspects and advantages of the present invention will become apparent from the following detailed description, taken in conjunction with the accompanying drawings, illustrating by way of example the principles of the invention.

DESCRIPTION OF THE PREFERRED EMBODIMENTS

Figure 1:
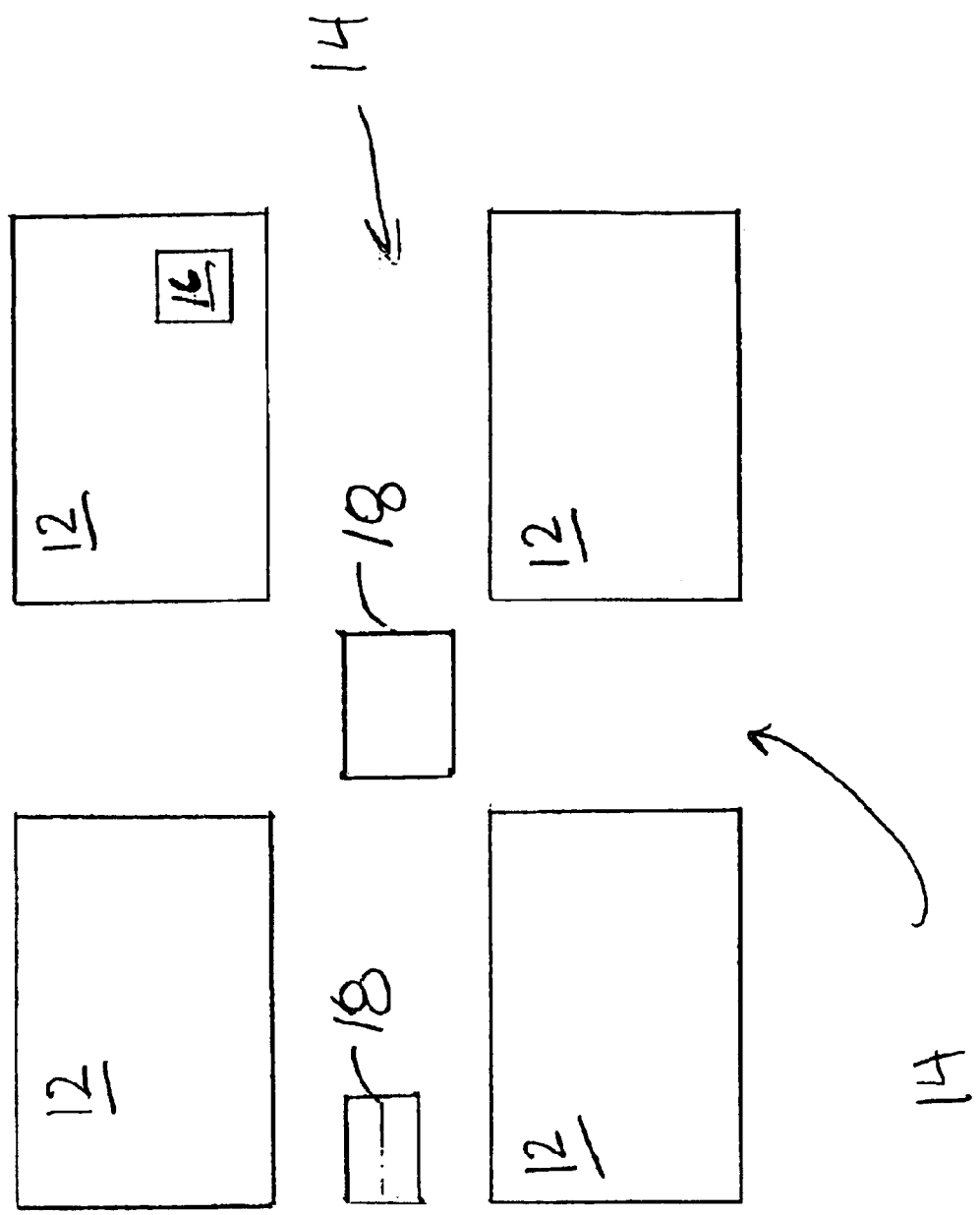
FIG. 1 is a diagram of an integrated circuit according to an embodiment of the invention.

FIG. 1 is a diagram of an integrated circuit 10 according to an embodiment of the invention. The integrated circuit 10 includes regions, here blocks 12, where functional circuitry is disposed. In one embodiment, functional circuitry provides the functions and features that the integrated circuit 10 is designed to perform. For example, functional circuitry may include memory arrays, amplifiers, or processing circuits. The integrated circuit 10 also includes a region 14 that is devoid of functional circuitry. The region 14 is primarily located between the functional-circuit blocks 12, but also includes devoid subregions 16, which may be located within some or all of the blocks 12. Transistor arrays 18 are disposed within the devoid region 14, and each array 18 may include any number and type of transistors. As discussed below, the transistors in the arrays 18 may be used for many purposes, including power-supply bypass, signal buffering, electrostatic-discharge (ESD) protection, and repairing the functional circuitry.

Figure 2:
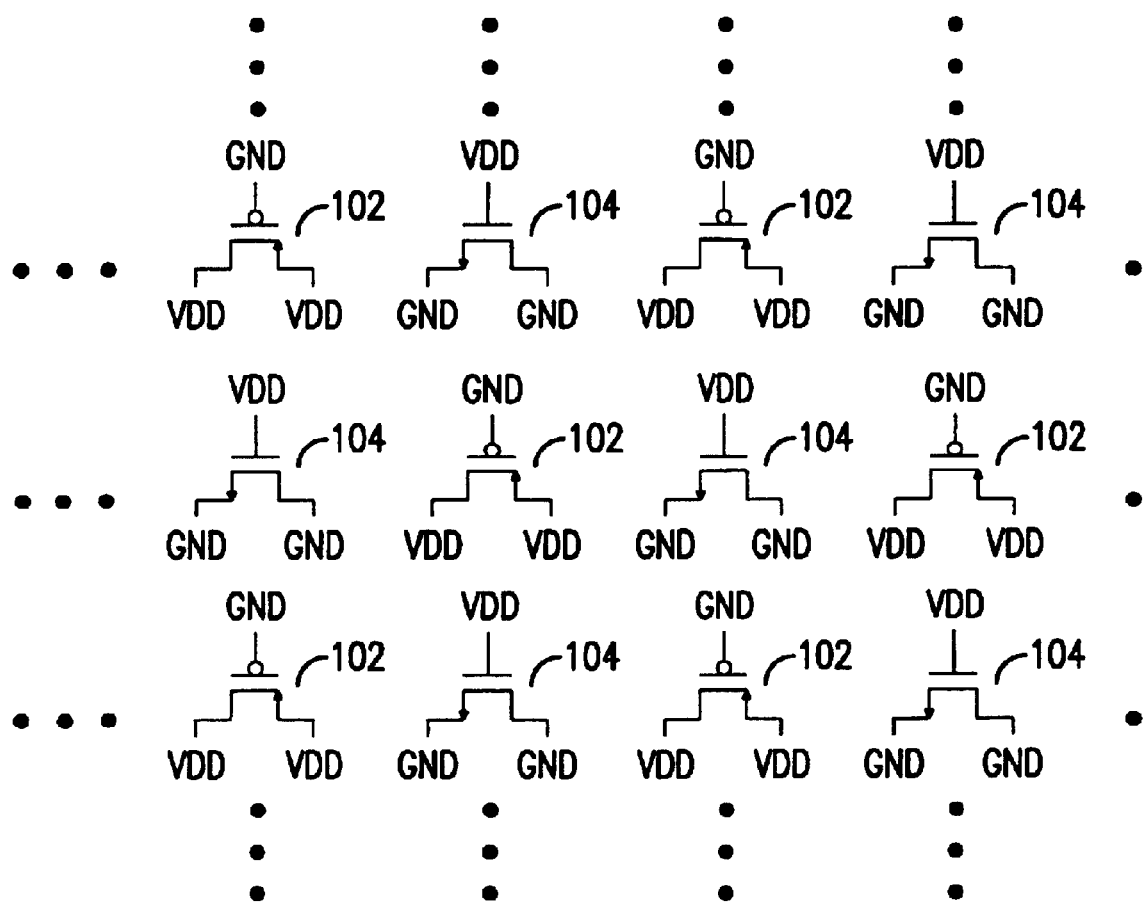
FIG. 2 is a schematic representation of an embodiment of a MOSFET array with PFETs and NFETs arranged in a checkerboard pattern. The transistors in the array are connected to accomplish suppression of power supply noise and radiated emission.

One embodiment of this invention is shown in FIG. 2. In this case, the NFETs 104 and PFETs 102 are arranged in a checkerboard pattern. These transistors are connected to form bypass capacitors between a positive supply node (VDD) and a negative supply node (GND). This checkerboard pattern of n-channel field effect transistors (NFETs) and p-channel field effect transistors (PFETs) allows for easy construction of many complementary metal-oxide-silicon (CMOS) devices and may be efficient to build in some circuit floorplans.

Figure 3:
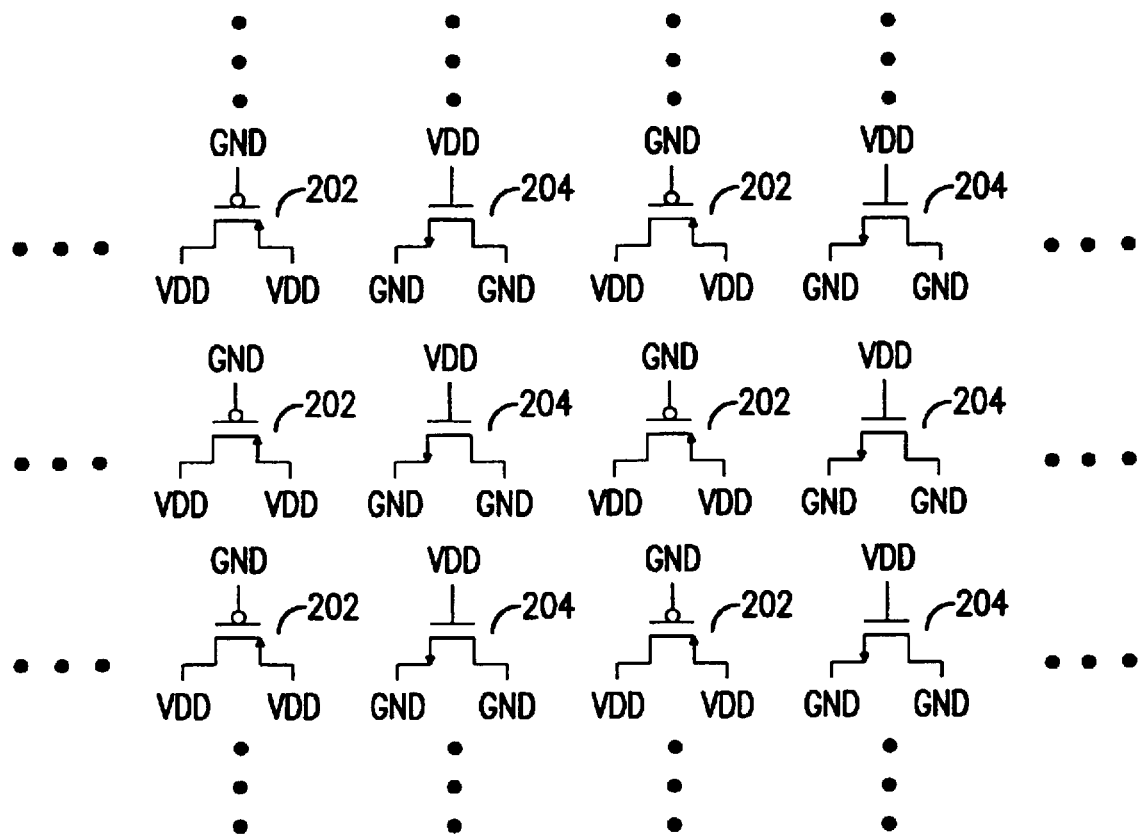
FIG. 3 is a schematic representation of an embodiment of a MOSFET array with PFETs and NFETs arranged in columns.

Another embodiment of this transistor array is illustrated in FIG. 3. In this example, an array of MOSFETs is constructed in a column pattern. In FIG. 3, PFETs 202 have their sources and drains connected to the positive supply node (VDD) and their gates connected to a negative supply node (ground or GND). NFETs 204 have their sources and drains connected to ground and their gates connected to the positive supply node (VDD). In this and the previous (FIG. 2) configurations, the MOSFETs act as capacitors between the positive supply node (VDD) and a negative supply node (GND) through the gate oxide. This acts as bypass capacitance between the power supplies and reduces switching noise on the supplies. Also, by reducing the magnitude of this switching noise, the high frequency components are reduced, that in turn, reduces the radiated emissions of the circuit. In the case of MOSFETs, the source may be referred to as an input terminal, the drain may be referred to as an output terminal, and the gate may be referred to as a control terminal. Note that in some cases, the source and drain are interchangeable and the source may be referred to as an output terminal and the drain may be referred to as an input terminal.

Figure 4:
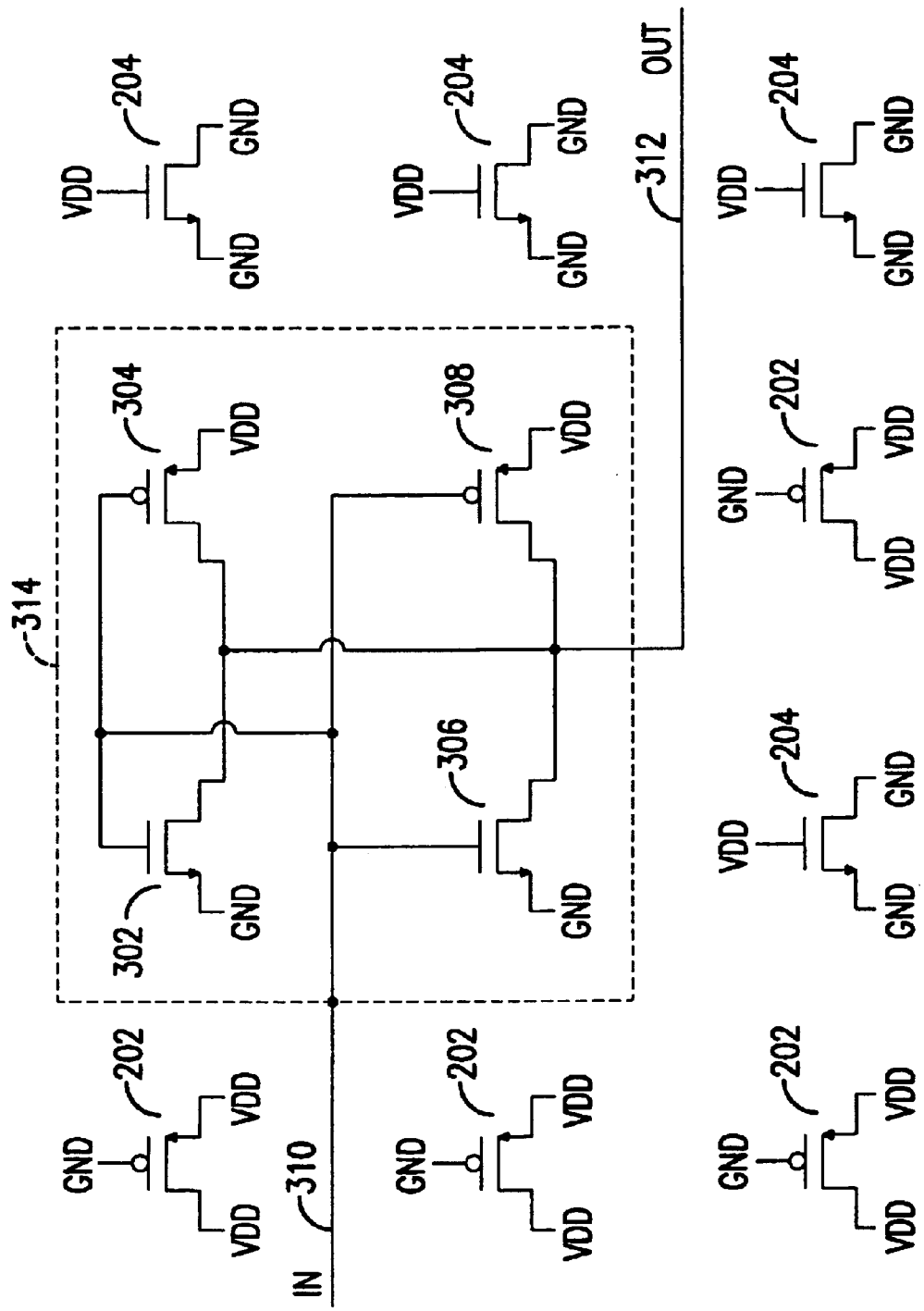
FIG. 4 is a schematic of a portion of the array of FIG. 3 when a portion of the transistors, enclosed in the dashed rectangle, are connected to form an inverting buffer.

FIG. 4 shows the use of an array of MOSFETs, like those in FIG. 3, with a portion of the array modified to form an inverting buffer 314 for a signal. Once again, as in FIG. 2, PFETs 202 and NFETs 204 are arrayed in a column pattern. The connections between some of the transistors and the power supplies are then broken so that the transistors can be reconnected to form an inverting buffer. In the buffer of FIG. 4, two small inverters are formed in parallel to increase the drive of the inverting buffer 314. NFET 302 and PFET 304 form one inverter, while NFET 306 and PFET 308 form the other inverter. The drain of NFET 302 is disconnected from GND and connected to OUT 312, while the gate is disconnected from VDD and connected to IN 310. The drain of PFET 304 is disconnected from VDD and connected to OUT 312, while the gate is disconnected from GND and connected to IN 310. The drain of NFET 306 is disconnected from GND and connected to OUT 312, while the gate is disconnected from VDD and connected to IN 310. The drain of PFET 308 is disconnected from VDD and connected to OUT 312, while the gate is disconnected from GND and connected to IN 310. The input to the inverting buffer (IN 310) is connected to the gates of the FETs used to form the inverters, and the output (OUT 312) is connected to their drains. This inverting buffer 314 is constructed by modifying only interconnect layers. This is easier than adding inverter blocks to the design, since less modification to the circuit is required in changing interconnect layers in a local area than adding inverter blocks and changing the interconnect to hook up the inverters. This modification allows the designer to add the buffer without changing any of the lower layers of the integrated circuit. The buffer may be placed in nearly the optimal location for accomplishing the task of signal buffering by selecting the appropriate transistors in the array.

Still referring to FIG. 4, one can form logic circuits other than an inverter from the transistors 202 and 204. For example, one can form logic gates such as AND, NAND, OR, NOR, XOR, or NXOR gates (not shown) having two or more input terminals.

Figure 5A:
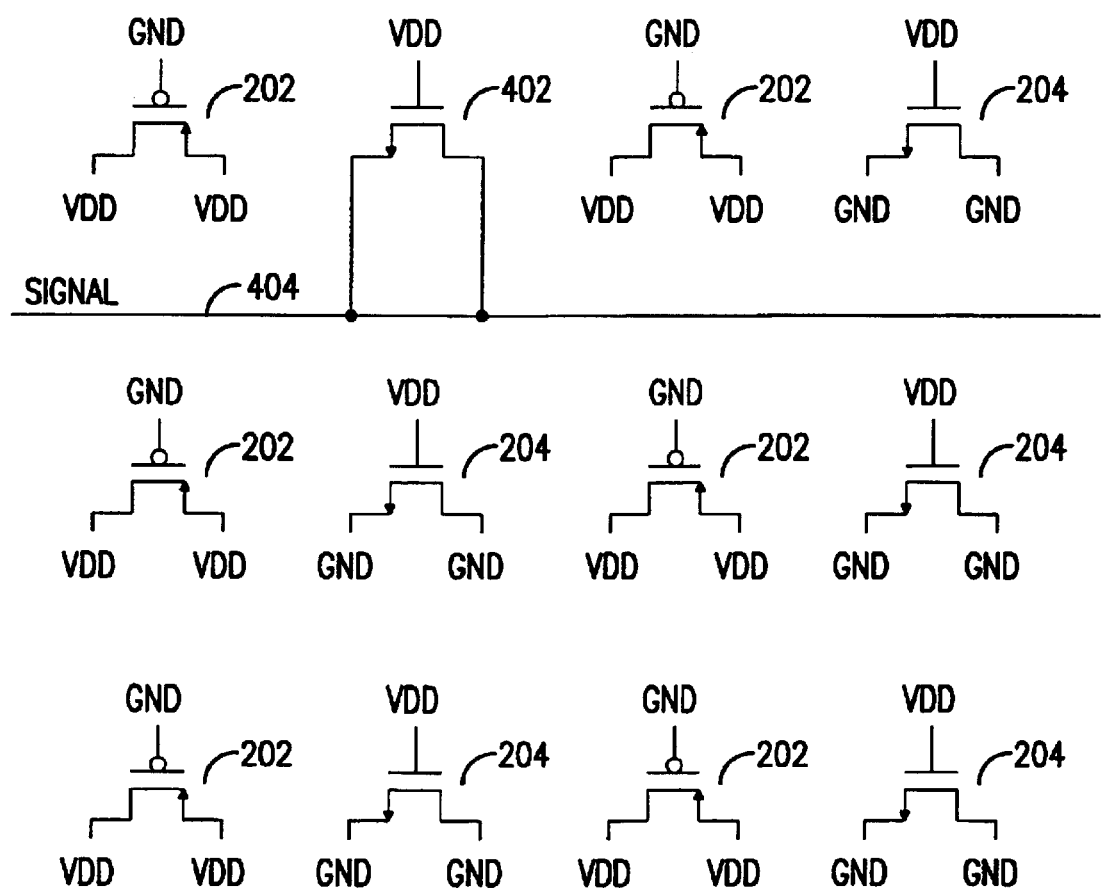
FIGS. 5A and 5B are schematics of a portion of the array of FIG. 3 when connected to a routed signal to form a diode that will drain charge from the metal line during processing.
Figure 5B:
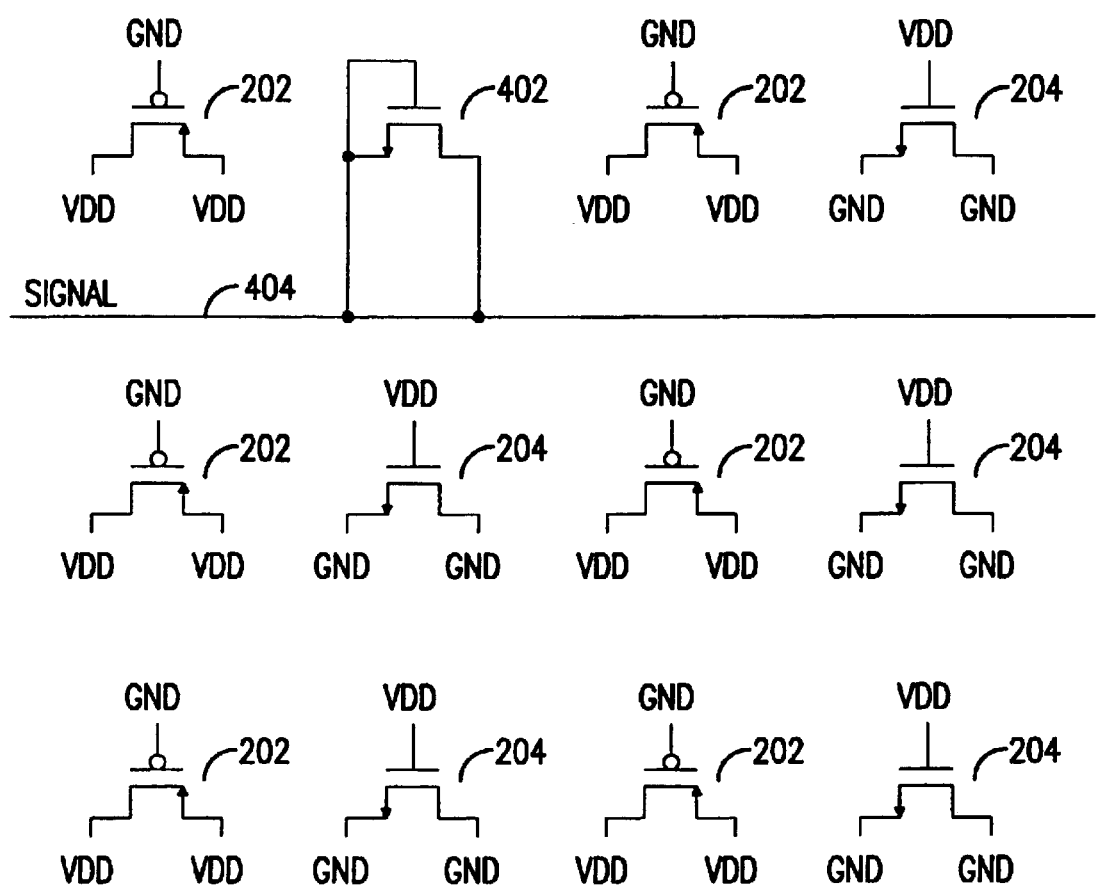
Figure 5C:
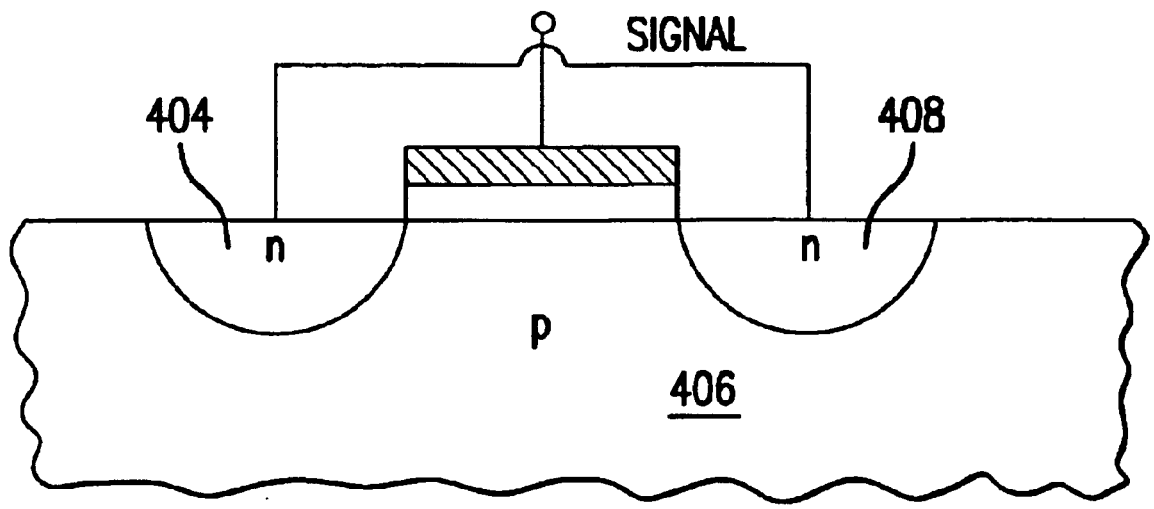
FIGS. 5C and 5D are cross sections of the diode-connected transistors of FIGS. 5A and 5B, respectively.
Figure 5D:
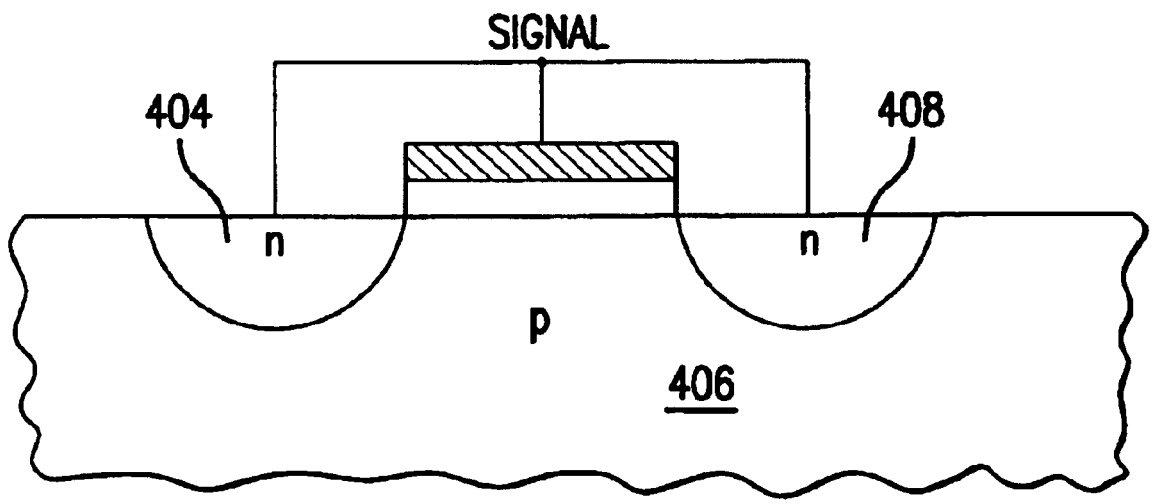

When it becomes necessary to place a diode on a signal to remove charge from that interconnect trace during processing, a circuit such as that shown in FIG. 5A may be constructed. In this case, the PFETs 202 and NFETs 204 are arrayed in a column pattern as shown in FIG. 2. One specific NFET 204 is identified as NFET 402 and then rewired to connect its source and drain to the SIGNAL 404 requiring the charge draining diode. This SIGNAL 404 may be a metal trace that was routed over the transistor array, and NFET 402 may have been the easiest NFET to connect to. The gate of the NFET 402 may be coupled to VDD (as shown in FIG. 5A) or GND, or may be shorted to the source or drain of the transistor 402 as shown in FIG. 5B. FIGS. 5C and 5D are cross-sections of the transistor 402 in FIGS. 5A and 5B, respectively. The protection diode is formed from the pn junctions between the source 404 and the substrate 406 and between the drain 408 and the substrate 406. The substrate 406 may be grounded or back-biased in a conventional manner.

Figure 6:
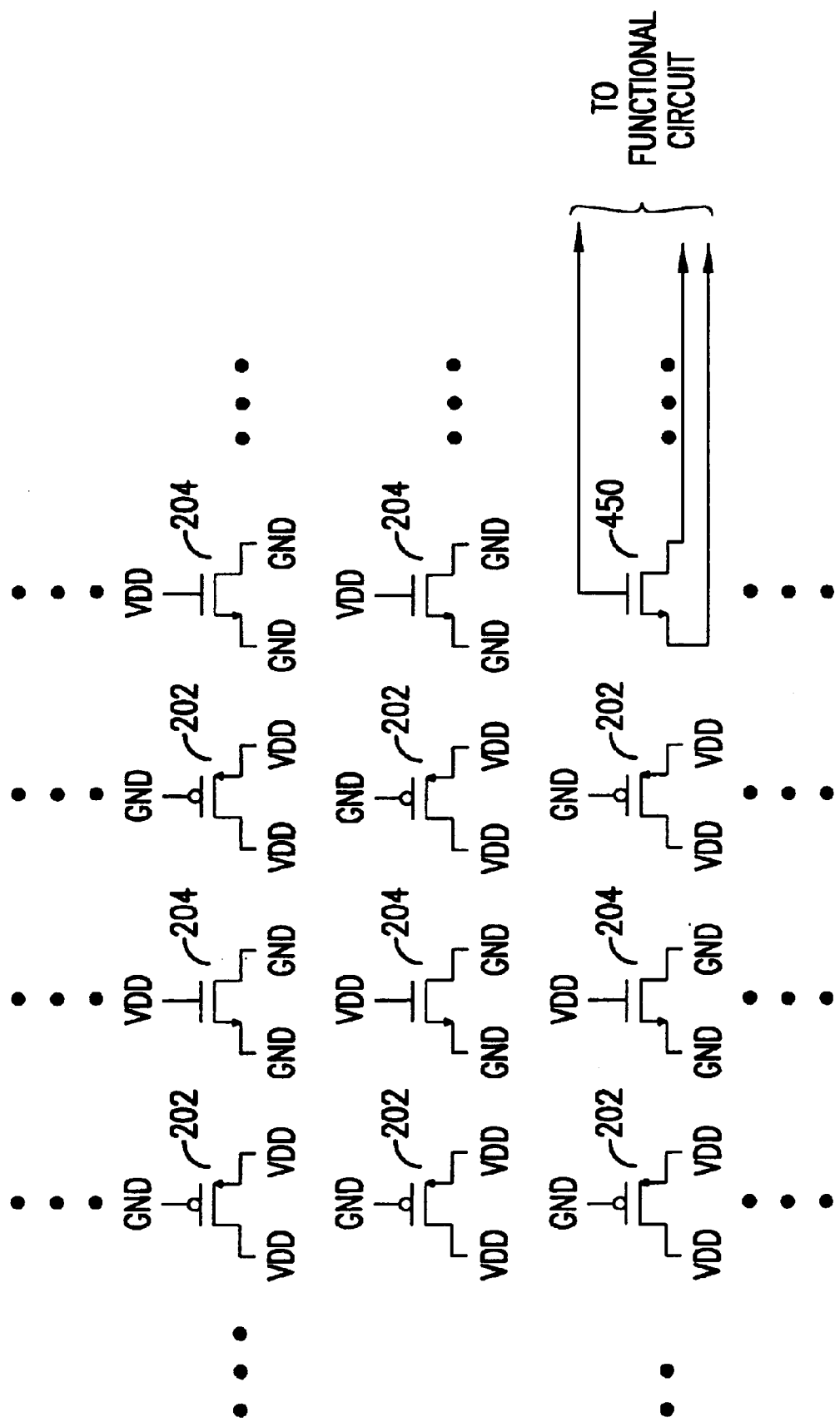
FIG. 6 is a schematic of a portion of the array of FIG. 3 where a transistor of the array is coupled to functional circuitry.

FIG. 6 is a schematic of a portion of the array of FIG. 3 where a transistor 450 of the array is coupled to functional circuitry (FIG. 1). For example, the transistor 450 may be coupled to replace a defective transistor (not shown) in the functional circuitry or to otherwise repair the functional circuitry. Or, the transistor 450 may impart additional functionality to the functional circuitry, functionality that was perhaps first contemplated after the functional circuitry was initially designed. Although all three terminals of the transistor 450 are shown coupled to the functional circuitry, fewer than all of the transistor terminals may be coupled thereto. Furthermore, although one transistor 450 is shown coupled to the functional circuitry, more than one transistor of the array may be coupled thereto.

Figure 7:
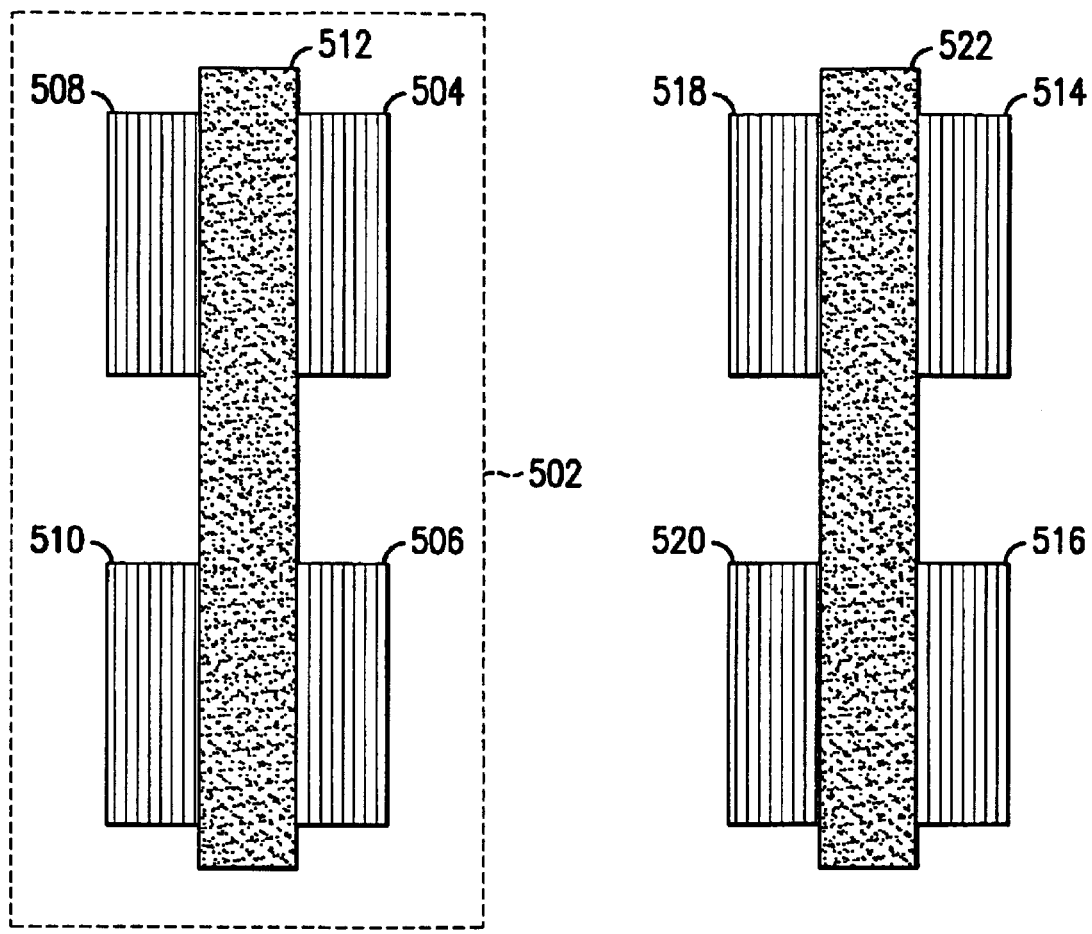
FIG. 7 is a sample layout of a portion of the array of FIG. 3.

FIG. 7 is included as a sample layout of a portion of the transistor array from FIG. 3. Using a typical CMOS process, PFETs are constructed within an n-well 502. The source 504 and drain 508 of one PFET are placed directly adjacent the source 506 and drain 510 of another PFET. This allows the sources to be easily connected together with a strip of interconnect (not shown). The drains may likewise be connected with another strip of interconnect (also not shown). The gates of the PFETs may be built and connected with a single strip of polysilicon 512. In a similar manner, the NFETs are constructed outside of the n-well 502. In this case, the drains 514 and 516 of the NFETs are aligned. The sources 518 and 520 are also aligned, allowing easy connection with strips of interconnect. The gates of the NFETs are built and connected with a single strip of polysilicon 522.

Figure 8:
FIG. 8 is a schematic representation of the layout of FIG. 7.

FIG. 8 is a schematic representation of the layout shown in FIG. 7 with all of the corresponding nodes of the FETs labeled as in FIG. 7.

One embodiment of this transistor array comprises the placement of transistors in an array throughout all of the areas of an integrated circuit where it is possible to do so without interfering with an existing circuits. One of normal skill in the art will appreciate that this may be accomplished by a number of different processes. Given a step and repeat function in the circuit generation software, it would be easy to add an array of these devices by hand. The placement could be further automated through the writing of simple scripts, such as that diagrammed in FIG. 9, to examine the existing floorplan and automatically place an array of transistors in any open areas of the floorplan. This process is not limited to the top level of integrated circuit design, but in hierarchical design may be implemented at any level of the hierarchy of the design.

Figure 9:
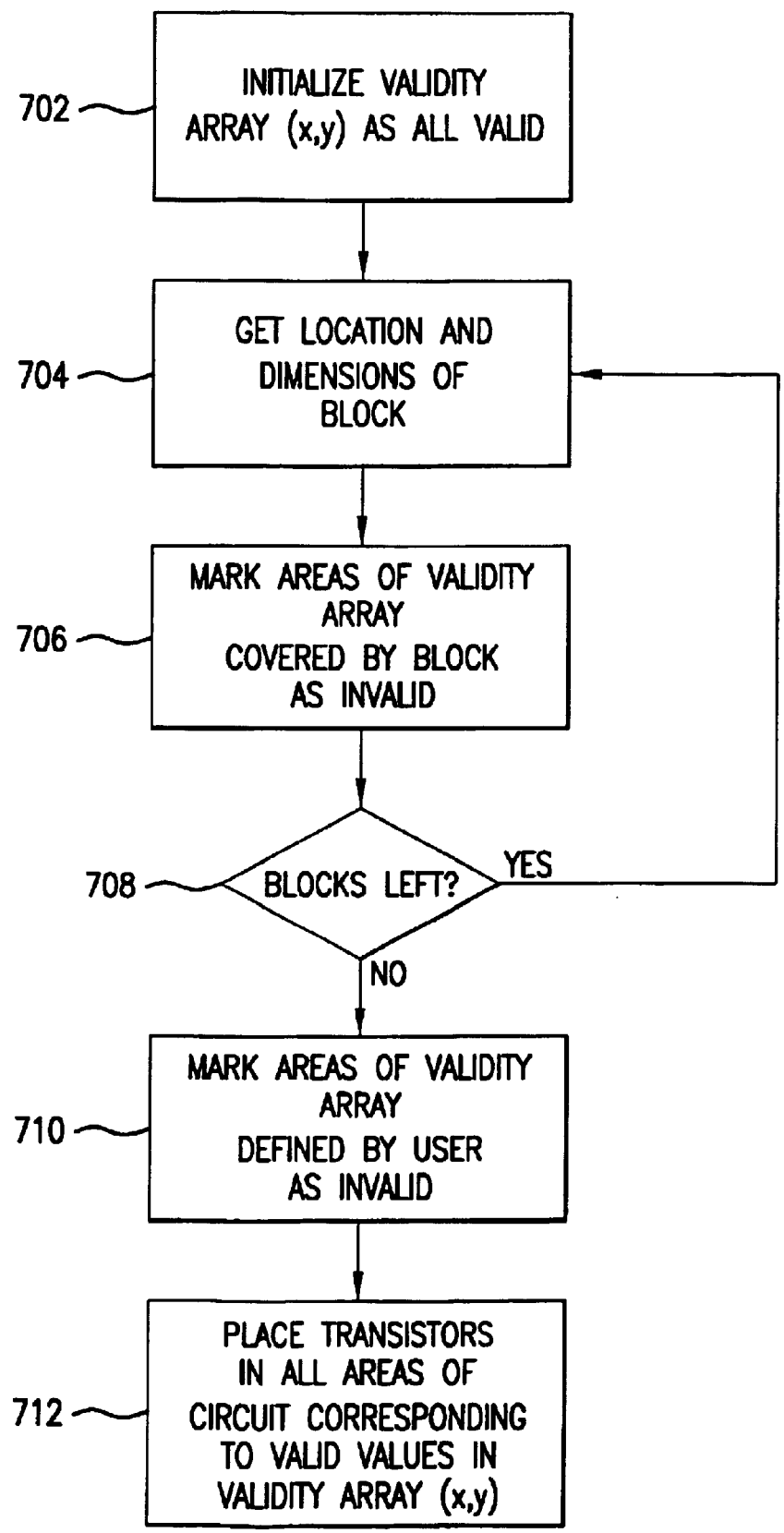
FIG. 9 is a flowchart of a computer program that may be used to create the transistor arrays.

FIG. 9 is a flowchart of a computer program that may be used to automatically place the transistor arrays. First, a validity array must be initialized in the proper dimensions (step 702). All elements of this validity array are initialized to a valid value. The dimensions are determined by dividing the chip dimensions by the dimensions of one block of the transistor array and truncating the result. Note that one block of the transistor array may contain any number of transistors. Next, the program takes the data for the first block from a list of all the blocks on the chip containing circuitry. Since the transistor arrays must not be placed in these areas, given the location and dimensions of the block, one may easily calculate the locations in the array representing the chip which must then be marked as invalid for placement of a transistor array (step 706). Next, the program checks to see if there are any blocks left to parse (step 708), and if so, it jumps back to step 704. If no blocks are left, the program continues on to step 710, where the user is allowed to select area of the chip to avoid and these areas are marked in the validity array as invalid. Finally, the program places blocks of transistors in all of the places where allowed in the array (step 712).

Furthermore, this transistor array may be used not only with MOSFETs but many of the features may be useful in a similar array of bipolar or other devices. Bipolar transistors may be connected to reverse bias both the base-emitter diode and the base-collector diodes and thereby act as buffer capacitors between power supplies. Also, it may be useful to have an array of bipolar devices readily available for easy construction of buffers or other logic in the channels between block.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed:

1. An integrated circuit, comprising:
    functional-circuit blocks that are spaced apart from one another, each block having a respective boundary that surrounds the block;
    a region disposed outside of the boundaries of the functional-circuit blocks and devoid of functional-circuit blocks; and
    a transistor disposed in the region and having been placed in the region during the design of the integrated circuit after the functional-circuit blocks were placed.

2. The integrated circuit of claim 1 wherein one of the functional-circuit blocks is configured to perform a predetermined function.

3. An integrated circuit, comprising:
    functional-circuit blocks that are spaced apart from one another;
    a region disposed between the functional-circuit blocks and devoid of functional-circuit blocks;
    a transistor disposed in the region; and
    wherein one of the functional-circuit blocks is unconfigured.

4. The integrated circuit of claim 1 wherein the transistor comprises an FET transistor.

5. An integrated circuit, comprising:

functional-circuit blocks that are spaced apart from one another;

a region disposed between the functional-circuit blocks and devoid of functional-circuit blocks;

a transistor disposed in the region; and wherein the transistor is automatically placed in the devoid region after the functional-circuit blocks are placed.

6. An integrated circuit, comprising:

functional-circuit blocks that are spaced apart from one another;

a region disposed between the functional-circuit blocks and devoid of functional-circuit blocks;

a transistor disposed in the region; and wherein the transistor is manually placed in the devoid region after the functional-circuit blocks are placed.

7. An integrated circuit, comprising:

functional-circuit blocks that are spaced apart from one another, each block having a respective boundary that surrounds the block;

a region located between and outside the boundaries of the functional-circuit blocks, devoid of functional-circuit blocks, and defined during the design of the integrated circuit after the locations of the functional-circuit blocks were defined; and a buffer disposed in the region and coupled to one of the functional-circuit blocks.

8. An integrated circuit, comprising:

functional-circuit blocks that are spaced apart from one another, each block having a respective boundary that surrounds the block;

a region located between and outside the boundaries of the functional-circuit blocks, devoid of functional-circuit blocks, and defined during the design of the integrated circuit after the locations of the functional-circuit blocks were defined; and a logic circuit disposed in the region and coupled to one of the functional-circuit blocks.

9. The integrated circuit of claim 8 wherein the logic circuit comprises a logic gate.

10. The integrated circuit of claim 8 wherein the logic circuit comprises an inverter.

11. An integrated circuit, comprising:

first and second supply nodes;

functional-circuit blocks that are spaced apart from one another, one of the functional-circuit blocks coupled to the first and second supply nodes;

a region located between the functional-circuit blocks and devoid of functional-circuit blocks; and a transistor disposed in the region and having a pair of input-output terminals coupled to the first supply node and having a control terminal coupled to the second supply node.

12. The integrated circuit of claim 11 wherein:

the transistor comprises an FET transistor;

the pair of input-output terminals comprises a pair of source-drain terminals; and the control terminal comprises a gate terminal.

13. An integrated circuit, comprising:

a conductive path;

functional-circuit blocks that are spaced apart from one another, each of the blocks having a respective boundary that surrounds the block, one of the functional-circuit blocks coupled to the conductive path;

a region located between and outside the boundaries of the functional-circuit blocks and devoid of functional-circuit blocks; and a transistor disposed in the region and having a pair of input-output terminals coupled to the conductive path and having a control terminal, the transistor having been designated for disposition in the region during the design of the integrated circuit after the functional-circuit blocks were designated for disposition in respective locations of the integrated circuit.

14. The integrated circuit of claim 13, further comprising:

a supply node; and wherein the control terminal is coupled to the supply node.

15. The integrated circuit of claim 13 wherein the control terminal is coupled to one of the input-output terminals.

16. The integrated circuit of claim 13 wherein the control terminal is short-circuited to one of the input-output terminals.

17. An integrated circuit, comprising:

first and second regions that are spaced apart from one another and that have first and second boundaries that respectively surround the first and second and second regions;

first and second functional-circuit blocks respectively disposed in the first and second regions and entirely within the first and second boundaries;

a third region located between the first and second functional-circuit blocks and outside of the first and second boundaries and devoid of functional-circuit blocks, the third region having been defined during the design of the integrated circuit after the first and second functional-circuit blocks had been designated for disposition in the first and second regions;

a buffer disposed in the third region and having an input terminal and an output terminal;

a first conductive path having a first terminal coupled to the first functional-circuit block and having a second terminal coupled to the input terminal of the buffer; and a second conductive path having a first terminal coupled to the output terminal of the buffer and having a second terminal coupled to the second functional-circuit block.

18. The integrated circuit of claim 17 wherein the first and second functional-circuit blocks are operable to perform first and second predetermined functions, respectively.

19. The integrated circuit of claim 17, further comprising:

a supply node; and wherein the buffer comprises a transistor disposed in the third region and having a control terminal coupled to the input terminal of the buffer, a first terminal coupled to the output terminal of the buffer, and a second terminal coupled to the supply node.

20. An integrated circuit, comprising:

first and second regions that are spaced apart from one another and that have first and second boundaries that respectively surround the first and second and second regions;

first and second functional-circuit blocks that are respectively disposed in the first and second regions and entirely within the first and second boundaries;

a third region located between the functional-circuit blocks and outside of the first and second boundaries, and devoid of functional-circuit blocks, the third region having been defined during the design of the integrated circuit after the first and second functional-circuit blocks had been designated for disposition in the first and second regions;

a logic circuit disposed in the third region and having an input terminal and an output terminal;

a first conductive path having a first terminal coupled to the first functional-circuit block and having a second terminal coupled to the input terminal of the logic circuit; and a second conductive path having a first terminal coupled to the output terminal of the logic circuit and having a second terminal coupled to the second functional-circuit block.

21. An integrated circuit, comprising:

functional-circuit blocks spaced apart from one another and each having a respective boundary that surrounds the block;

a region located between and outside the boundaries of the functional-circuit blocks and devoid of functional-circuit blocks; and a repair transistor disposed in the region and having a three terminals, one of the terminals coupled to one of the functional-circuit blocks, the repair transistor having been placed in the region during the design of the integrated circuit after the placement of the functional-circuit blocks.

22. The integrated circuit of claim 21 wherein two of the transistor terminals are coupled to the one functional-circuit block.

23. The integrated circuit of claim 21 wherein the three transistor terminals are coupled to the one functional-circuit block.

* * * * *